United States Patent
Lutker-Lee et al.

(10) Patent No.: US 11,410,852 B2
(45) Date of Patent: Aug. 9, 2022

(54) PROTECTIVE LAYERS AND METHODS OF FORMATION DURING PLASMA ETCHING PROCESSES

(71) Applicant: Tokyo Electron Limited, Tokyo (JP)

(72) Inventors: Katie Lutker-Lee, Albany, NY (US); Angelique Raley, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/692,564

(22) Filed: Nov. 22, 2019

(65) Prior Publication Data

US 2021/0159082 A1  May 27, 2021

(51) Int. Cl.
  *H01L 21/3065* (2006.01)
  *H01L 21/308* (2006.01)

(52) U.S. Cl.
  CPC .... *H01L 21/30655* (2013.01); *H01L 21/3081* (2013.01); *H01L 21/3083* (2013.01)

(58) Field of Classification Search
  CPC .......... H01L 21/30655; H01L 21/3083; H01L 21/3081; H01L 21/0332; H01L 21/0335
  USPC ....... 438/700, 706, 710, 714, 717, 719, 723, 438/736
  See application file for complete search history.

(56) References Cited

U.S. PATENT DOCUMENTS

| | | | |
|---|---|---|---|
| 9,543,148 B1* | 1/2017 | Hudson | H01L 21/31116 |
| 2013/0164657 A1* | 6/2013 | Altamirano Sanchez | H01L 21/0273 430/5 |
| 2016/0013070 A1* | 1/2016 | Jeon | H01L 21/0337 438/478 |
| 2016/0049305 A1* | 2/2016 | Mebarki | H01L 21/3088 438/700 |
| 2021/0057569 A1* | 2/2021 | Huang | H01L 21/76883 |

* cited by examiner

*Primary Examiner* — Lan Vinh
(74) *Attorney, Agent, or Firm* — Weihrouch IP

(57) ABSTRACT

A method of plasma etching includes receiving, by a plasma processing apparatus, a substrate into a processing chamber of the plasma processing apparatus. The substrate includes an etchable layer and a first mask layer overlying the etchable layer. The first mask layer includes a plurality of openings vertically aligned with exposed regions of the etchable layer. The method further includes forming, in the processing chamber, a protective layer over the first mask layer and the exposed regions and etching, in the processing chamber, the protective layer and the exposed regions to remove the protective layer and form recesses in the etchable layer.

25 Claims, 5 Drawing Sheets

PROTECTIVE LAYERS AND METHODS OF FORMATION DURING PLASMA ETCHING PROCESSES

TECHNICAL FIELD

The present invention relates generally to methods of plasma etching including formation of protective layers, and, in particular embodiments, to structures of protective layers for use during plasma etching processes, and methods of formation during plasma etching processes.

BACKGROUND

Device formation within microelectronic workpieces may involve a series of manufacturing techniques including formation, patterning, and removal of a number of layers of material on a substrate. Plasma processes such as plasma etching processes are commonly used to form devices in microelectronic workpieces. As structure size decreases and density of structures increases, desired pattern fidelity may be become more difficult to guarantee during plasma etching processes.

Etch selectivity is important during plasma etching to increase pattern fidelity for a variety of reasons. For example, higher etch selectivity decreases optimal mask thickness, increases productivity, maintains pattern integrity during the etching process, improves etch profile, and reduces the likelihood of merged patterns and/or line breaks. Changing the chemical composition of the mask is one way to increase etch selectivity. However, changing the chemical composition of the mask may negatively impact other aspects of the fabrication process such as increasing cost, reducing throughput, or removing process compatibility.

Another possible method of improving etch selectivity is to change or tune the plasma etching process. For example, continuous wave plasma etching processes may be replaced with atomic layer etching (ALE) processes. Yet, ALE processes require additional processing steps to modify each atomic layer that is etched resulting in reduced throughput. Tuning plasma etching processes for increased etch selectivity also typically results in longer process times because slower processes can be more selective. For example, lower ion bombardment energy can improve selectivity, but will decrease throughput. Further, process tuning for selectivity may have tradeoffs (sidewall profile angle modification, critical dimension, damage, etc.). Therefore, it may be desirable to improve etch selectivity during plasma etching processes without changing the mask film type and while maintaining the desired levels of throughput and the final feature characteristic (angle, critical dimension, etc.).

SUMMARY

In accordance with an embodiment of the invention, a method of plasma etching includes receiving, by a plasma processing apparatus, a substrate into a processing chamber of the plasma processing apparatus. The substrate includes an etchable layer and a first mask layer overlying the etchable layer. The first mask layer includes a plurality of openings vertically aligned with exposed regions of the etchable layer. The method further includes forming, in the processing chamber, a protective layer over the first mask layer and the exposed regions and etching, in the processing chamber, the protective layer and the exposed regions to remove the protective layer and form recesses in the etchable layer.

In accordance with another embodiment of the invention, a method of plasma processing includes forming a protective layer over a patterned mask layer and exposed regions of an etchable layer of a substrate. The protective layer includes a first thickness measured from upper surfaces of the patterned mask layer and a second thickness measured from exposed surfaces of the exposed regions. The first thickness is greater than the second thickness. The method further includes concurrently removing the protective layer and etching the etchable layer of the substrate at the exposed regions. The steps of forming the protective layer, removing the protective layer, and etching the etchable layer are performed in-situ during a plasma etch.

In accordance with still another embodiment of the invention, a method of plasma processing includes providing a substrate comprising an etchable layer and a patterned mask layer overlying the etchable layer and forming an in-situ protective layer over the patterned mask layer and exposed regions of the etchable layer. The patterned mask layer includes a dielectric hard mask, an upper hard mask overlying the dielectric hard mask, and a plurality of openings vertically aligned with the exposed regions of the etchable layer. The upper hard mask includes a metal, metal oxide, or a metal nitride. The method further includes performing a plasma etching step including etching the exposed regions of the etchable layer, removing the in-situ protective layer, and retaining the upper hard mask and the dielectric hard mask.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a conventional workpiece prior to etching and FIG. 1B illustrates the conventional workpiece after etching;

FIG. 2A illustrates a patterned mask layer overlying an etchable layer, FIG. 2B illustrates a protective layer formed over the patterned mask layer and the etchable layer, and FIG. 2C illustrates the patterned mask layer and the etchable layer after an etching process;

FIG. 3A illustrates a first mask layer and a second mask layer overlying an etchable layer, FIG. 3B illustrates a protective layer formed over the first mask layer, the second mask layer, and the etchable layer, and FIG. 3C illustrates the first mask layer, the second mask layer, and the etchable layer after an etching process;

FIG. 4A illustrates an etchable layer including recesses vertically aligned with openings in an overlying patterned mask layer, FIG. 4B illustrates a protective layer formed over the patterned mask layer and the recesses of the etchable layer, and FIG. 4C illustrates the patterned mask layer and the etchable layer after an etching process;

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Conventional methods of plasma etching may have a variety of disadvantages related to etch selectivity. For example, the edges of a given mask may be particularly susceptible to negative effects of reduced etch selectivity due to increased surface area available for etching. The result is a higher etch rate at the mask edges leading to edge rounding and, eventually, to reduction in the dimensionality of the mask pattern. Reduced mask dimensionality due to inadequate etch selectivity may resulting in merged patterns and/or line breaks and eventually pattern loss.

However, even if the dimensionality of the mask features remains intact, rounded feature edges may still induce negative effects on the final etch such as tapered etch profiles and footing. In cases where multiple mask layers are utilized, underlying mask material may also be disadvantageously removed which may negatively impact current and future etching processes.

Since corners represent the intersection of feature edges, corner selectivity may be especially important when attempting to improve pattern fidelity. At smaller feature sizes, corners become a larger percentage of the total and features may be more easily merged during the etching process. For example, small holes and thin lines may be particularly susceptible to merging or breaking due to low corner selectivity.

As mentioned above, conventional methods of improving etch selectivity may disadvantageously affect throughput, process compatibility, cost, and feature integrity. For example, ALE processes and quasi-ALE (QALE) processes may be very slow compared to continuous wave etching processes, but may improve etch selectivity. Yet, even changing or tuning the plasma etching process may still not result in desired feature profile, critical dimension (CD), layer damage, and the like. Changing the mask film type may increase cost, decrease throughput, or, in some cases, not be a viable option due to process compatibility considerations.

Figure 1A:
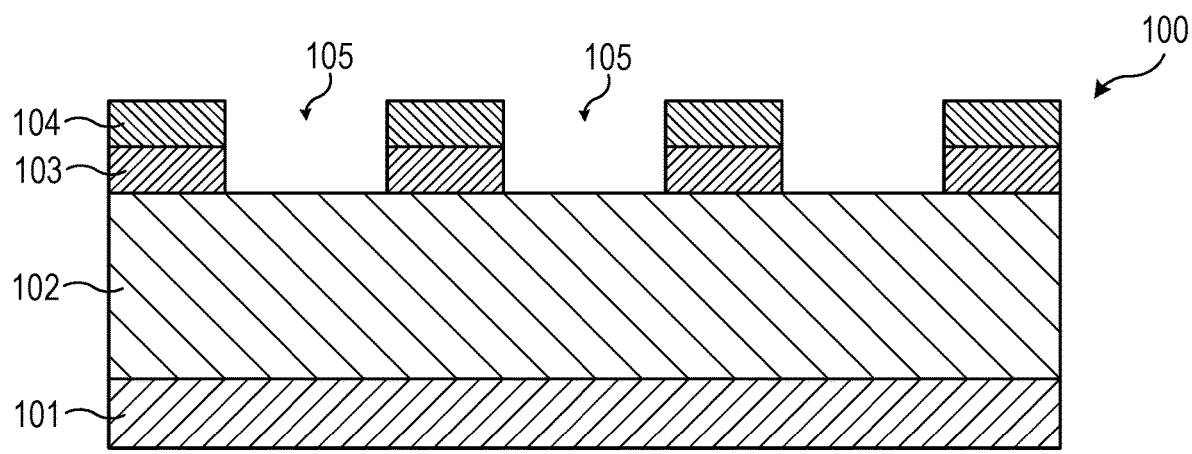
FIGS. 1A and 1B illustrate a conventional method of plasma etching, where
Figure 1B:
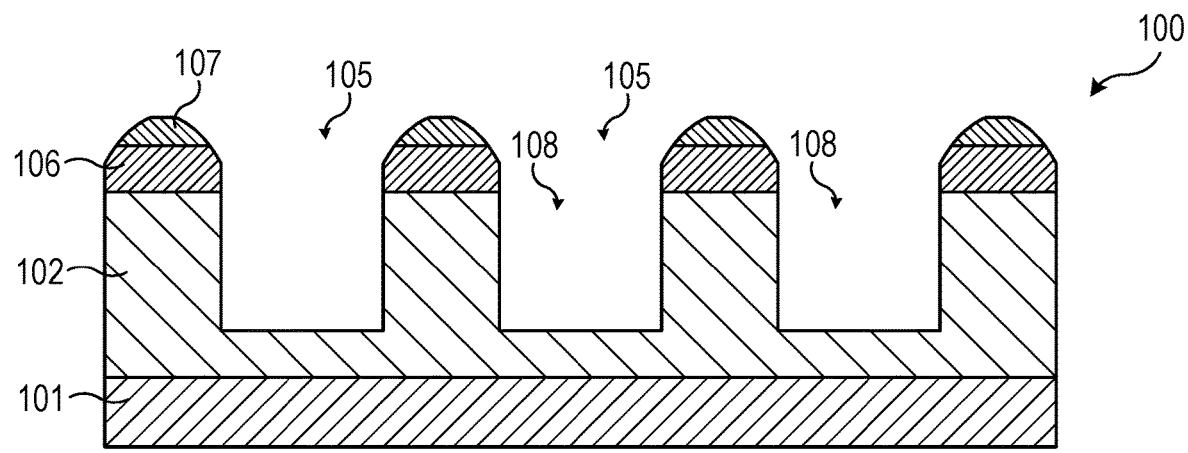

FIGS. 1A and 1B illustrate a conventional method of plasma etching, where FIG. 1A illustrates a conventional workpiece prior to etching and FIG. 1B illustrates the conventional workpiece after etching. The conventional method of plasma etching described in the following is included to provide context for comparison purposes and represents a single example of a disadvantageous conventional method of plasma etching which may be improved upon by the embodiments described herein.

Referring to FIG. 1A, a conventional workpiece 100 includes an ultra low-κ (ULK) dielectric layer 102 formed on a metallization layer 101. A dense dielectric layer 103 and a titanium nitride (TiN) layer 104 are patterned to include openings 105 and disposed on the ULK dielectric layer 102.

Referring to FIG. 1B, a plasma etching process is performed on the workpiece boo resulting in removal of material of the ULK dielectric layer 102, the dense dielectric layer 103, and the titanium nitride layer 104. Due to the etch selectivity being disadvantageously low, the plasma etching process alters the shape of the dense dielectric layer 103, and the titanium nitride layer 104 to form a rounded TiN layer 107. The rounded TiN layer 107 allows the plasma etching process to also remove material from the dense dielectric layer 103 which forms a compromised dense dielectric layer 106.

The resulting profile of the compromised dense dielectric layer 106 and the rounded TiN layer 107 adversely affects the conventional method of plasma etching leading to the formation of suboptimal recesses 108 in the ULK dielectric layer 102. The suboptimal recesses 108 include one or more of the disadvantages described above due to the excessive removal of material from the dense dielectric layer 103, and the titanium nitride layer 104.

In various embodiments, a method of plasma etching includes forming a protective layer over a mask layer and an underlying etchable layer. The protective layer is formed in-situ during the plasma etching process in a processing chamber of a plasma processing apparatus. The protective layer is subsequently removed during a plasma etch of the etchable layer.

The embodiments described herein may advantageously increase etch selectivity of mask layer during the etching process. For example, the corner selectivity during the etching process may be improved. The formation of the protective layer in-situ may advantageously improve throughput of the plasma etching process compared to conventional plasma etching processes. The protective layer may also beneficially afford increased flexibility in the selection of the film type of the mask layer and the type of etching process (e.g., enable continuous wave processes with good selectivity).

Embodiments provided below describe various structures and methods of forming a protective layer, and in particular, a protective layer formed in-situ during a plasma etching process. The following description describes the embodiments. An example method of plasma etching including forming a protective layer is described using FIGS. 2A, 2B, and 2C. Two additional example methods of plasma etching are described using FIGS. 3A, 3B, and 3C and FIGS. 4A, 4B, and 4C. Two further example methods of plasma processing are described using flowcharts in FIGS. 5 and 6.

The following embodiment methods of plasma etching may be advantageously applicable at all stages of semiconductor device fabrication. For example, the methods of plasma etching described herein may apply to back-end-of-line (BEOL) processing (e.g. metallization, interconnections, contacts, etc.). Additionally, these embodiment methods may also apply to front-end-of-line (FEOL) processing (e.g. devices) and/or middle-of-line (MOL) processing (e.g. device contacts).

Figure 2A:
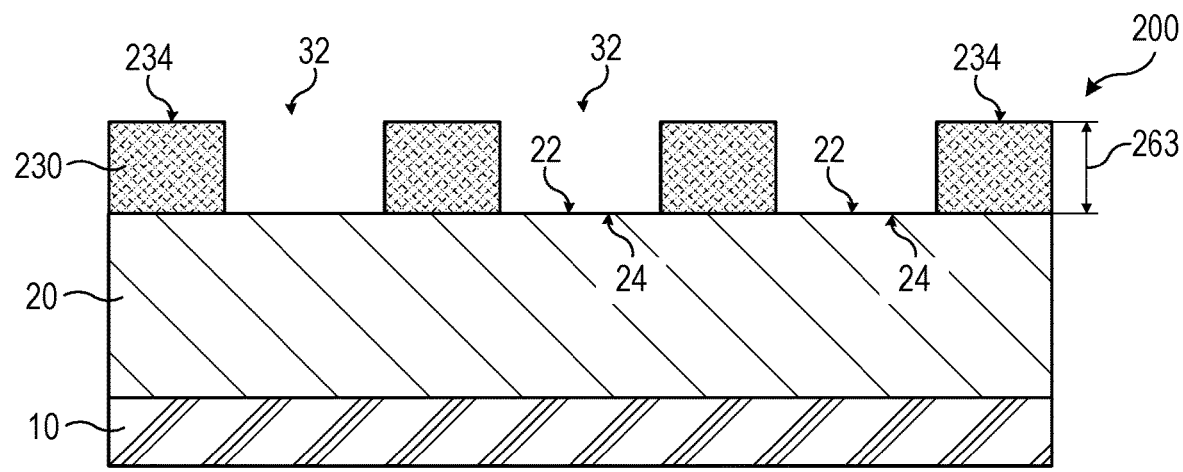
FIGS. 2A, 2B, and 2C illustrate an example method of plasma etching in accordance with an embodiment of the invention, where
Figure 2B:
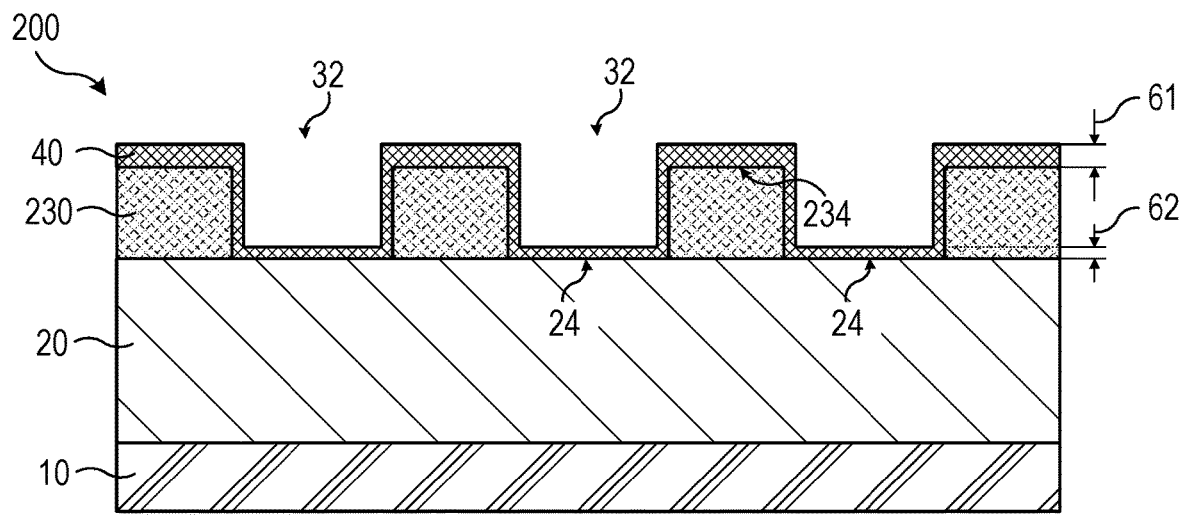
Figure 2C:
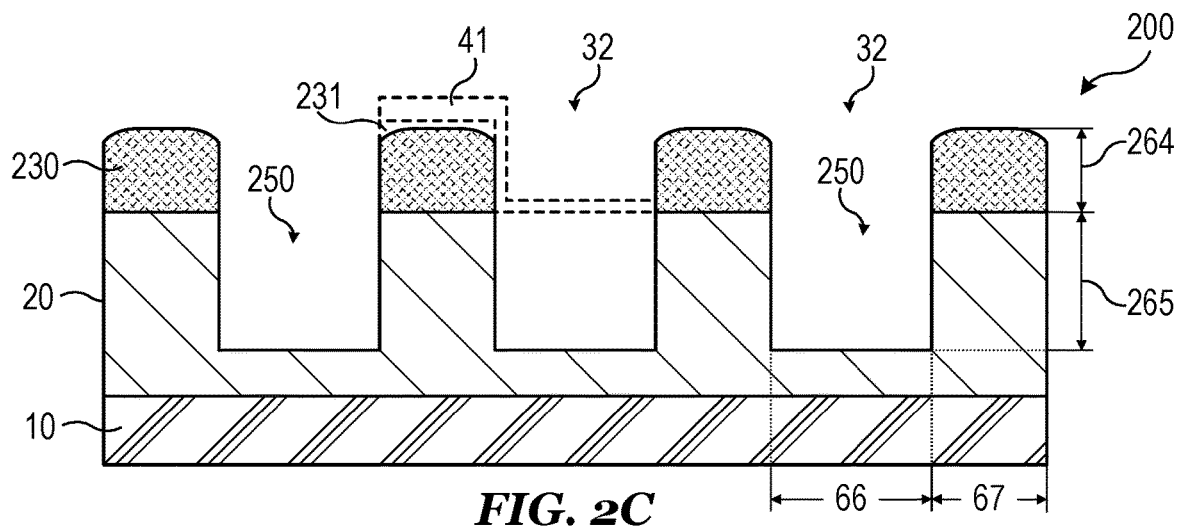

FIGS. 2A, 2B, and 2C illustrate an example method of plasma etching in accordance with an embodiment of the invention, where FIG. 2A illustrates a patterned mask layer overlying an etchable layer, FIG. 2B illustrates a protective layer formed over the patterned mask layer and the etchable layer, and FIG. 2C illustrates the patterned mask layer and the etchable layer after an etching process.

Referring to FIG. 2A, a workpiece 200 at an initial stage of a method of plasma etching includes an etchable layer 20 overlying a substrate 10. The substrate 10 may be any suitable material or combination of materials at any stage of processing. In various embodiments, the substrate 10 includes underlying layers. In some embodiments, the underlying layers include a metallization layer and include a backside metallization layer in one embodiment. The underlying layers may include a metal level zero (M0) or a metal level one (M1), for example. In another embodiment, the underlying layers include device layers. In various embodiments, the substrate 10 includes a semiconductor material. In one embodiment, the substrate 10 is a wafer.

The etchable layer 20 may directly contact the substrate 10 as shown. Alternatively, additional layers may be included between the substrate 10 and the etchable layer. The etchable layer 20 is a layer configured to be etched by the method of plasma etching. In various embodiments, the etchable layer 20 includes a dielectric (e.g., an oxide, a nitride, etc.), and is a low-κ dielectric or ULK dielectric in some embodiments. In some embodiments, the etchable layer 20 is a semiconducting material. For example, the etchable material may be silicon, germanium, a III-V semiconductor, a II-VI semiconductor, and the like. In other embodiments, the etchable layer 20 may include a metal such as aluminum, copper, tungsten, and others.

A patterned mask layer 230 overlies the etchable layer 20. The patterned mask layer 230 may be formed using any suitable combination of deposition method, growth technique, lithographic technique, direct write method, multi-patterning techniques, and others. In one embodiment, the patterned mask layer 230 is a layer of a single material. In other embodiments, the patterned mask layer 230 includes multiple layers of similar or different materials. For example, the patterned mask layer 230 may include dielectric materials, metal materials, and/or semiconductor materials. In various embodiments, the patterned mask layer 230 includes a dielectric layer and includes an oxide or a nitride in some embodiments. In one embodiment, the patterned mask layer 230 includes a ceramic material. The patterned mask layer 230 includes a first vertical thickness 263 measured vertically from the etchable layer 20 as illustrated.

The patterned mask layer 230 is patterned to include features with upper surfaces 234 defining openings 32 that are vertically aligned with exposed regions 22 of the etchable layer 20. The exposed regions 22 include exposed surfaces 24 of the etchable layer 20. The openings 32 may include any suitable shape when viewed from above. In one embodiment, the openings 32 include lines (e.g. features with a single dimension larger than the minimum feature size). In one embodiment, the openings 32 include holes (e.g. features of minimum size).

The workpiece 200 may be provided as described at the initial stage of a method of plasma etching. That is, the workpiece 200 may be received into a processing chamber of a plasma processing apparatus as illustrated in FIG. 2A, with openings 32 that reveal exposed surfaces 24 of an etchable layer 20 supported by a substrate 10. A vacuum suitable for plasma etching processes may then be created in the processing chamber and may be maintained (e.g. not broken) until after the conclusion of the plasma etching process. Specifically, although the pressure inside the processing chamber may fluctuate during the method of plasma etching, the pressure is always lower than the ambient pressure outside the processing chamber.

Referring to FIG. 2B, the workpiece 200 is shown after the formation of a protective layer 40. The protective layer 40 overlies both the patterned mask layer 230 and the etchable layer 20. The protective layer 40 is formed in-situ (i.e. in place) during the method of plasma etching. For example, the workpiece 200 may be a processing chamber as described above prior to the formation of the protective layer 40. The workpiece 200 is not removed from the processing chamber in order to form the protective layer 40. Rather, the protective layer 40 is formed in-situ in the processing chamber. Therefore, the protective layer 40 is an in-situ protective layer.

The protective layer 40 may have a higher etch selectivity than the etchable layer 20 to a particular etchant used to etch the etchable layer 20. For example, the etchant may etch the etchable layer 20 at a higher rate than the protective layer 40. The protective layer 40 may be a conformal layer in some embodiments. However, the thickness of the protective layer 40 is different above the upper surfaces 234 than above the exposed surfaces 24. For example, the protective layer 40 has a first thickness 61 above the upper surfaces 234 and a second thickness 62 above the exposed surfaces 24. In various embodiments, the first thickness 61 is greater than the second thickness 62. In some embodiments, the first thickness 61 is between about 1 nm and about 10 nm and is about 5 nm in one embodiment. The protective layer 40 is illustrated as forming on sidewalls of the patterned mask layer 230, but there is no requirement for this to be the case.

The protective layer 40 may be formed using any suitable process in-situ in the processing chamber. For example, the protective layer 40 may be formed using methods such as silicon precursor techniques (e.g. using $SiCl_4$, $SiF_4$, etc.), in-situ atomic layer deposition (ALD), sputter deposition, plasma polymerization (e.g. using precursors such as $CH_4$, etc.), direct current superposition (DCS) techniques, and the like. In various embodiments, the protective layer 40 is formed in less than about 60 s. In some embodiments, the protective layer 40 is formed in between about 10 s and 60 s. In one embodiment, the protective layer 40 is formed in about 20 s. Alternatively, the protective layer 40 may be formed over a time period longer than 60 s.

The protective layer 40 may include any suitable material, the choice of which may depend on the details of a given process such as etch type, composition of the etchable layer 20, composition of the patterned mask layer 230, throughput requirements, cost, complexity, and others. For example, the protective layer 40 may include silicon (e.g. may be silicon (Si), silicon oxide ($SiO_2$), silicon nitride ($Si_3N_4$), etc.). In various embodiments, the protective layer 40 includes an organic material such as an organic polymer. In some embodiments, the protective layer 40 is a fluorocarbon polymer.

Referring to FIG. 2C, the workpiece 200 includes recesses 250 in the etchable layer 20 after a plasma etching step is performed. The plasma etching step may utilize any suitable plasma etching technique. In one embodiment, the plasma etching step includes a continuous wave plasma etching technique. A continuous wave plasma etching step in combination with the protective layer 40 may advantageously improve etch selectivity while increasing throughput over conventional plasma etching methods. In addition, ALE or QALE may be used.

The protective layer 40 is fully removed while the patterned mask layer 230 and the etchable layer 20 are each partially removed. The partial removal of the etchable layer 20 results in the recesses 250. The partial removal of the patterned mask layer 230 reduces the thickness to a second vertical thickness 264. For reference purposes portions of the etched protective material 41 and the etched mask material 231 are shown using dotted lines.

The majority of the patterned mask layer 230 remains after the etching step. For example, in various embodiments, the second vertical thickness 264 is greater than 50% of the first vertical thickness 263. Additionally, the corner selectivity of the patterned mask layer 230 is advantageously improved using the protective layer 40 compared to conventional processes. For example, the shape of the corners of the patterned mask layer 230 is less rounded than those of conventional methods of plasma etching (as shown in FIG. 1B). The improved selectivity afforded by the use of the protective layer may advantageously improve one or a combination of the pattern integrity during the etching step, fidelity of the transferred pattern, improved (e.g. straighter) profile of the recesses 250, reduction or elimination of footing and other undesirable etching artifacts.

The recesses 250 include a vertical depth 65 and a first lateral width 66. The dimensions as illustrated are by way of example only. There are no requirements for the dimensions of any one recess to be equal to another. However, as described previously, corner selectivity may be more important for small feature sizes and/or dense patterns. Therefore, in specific cases, the patterned mask layer 230 may include regularly spaced recesses 250 that each include the first lateral width 66 and separated by a second lateral width 67, for example. Both the first lateral width 66 and the second lateral width 67 may be small. In some embodiments one or both of the first lateral width 66 and the second lateral width 67 are less than about 25 nm. In one embodiment, the first lateral width is about 20 nm. Similarly, in one embodiment, the second lateral width is about 20 nm.

As noted previously is relation to the shape of the openings 32, the recesses 250 may have any suitable shape such as lines, holes, etc. The aspect ratio of the recesses 250 may be large. For example, the recesses 250 may be deep trenches. In some embodiments, the vertical depth 65 is larger than the first lateral width 66. In one embodiment, the vertical depth 65 is greater than or equal to about twice the first lateral width 66. In various embodiments, the vertical depth 65 is between about 35 nm and about wo nm and is about 40 nm in one embodiment.

Figure 3A:
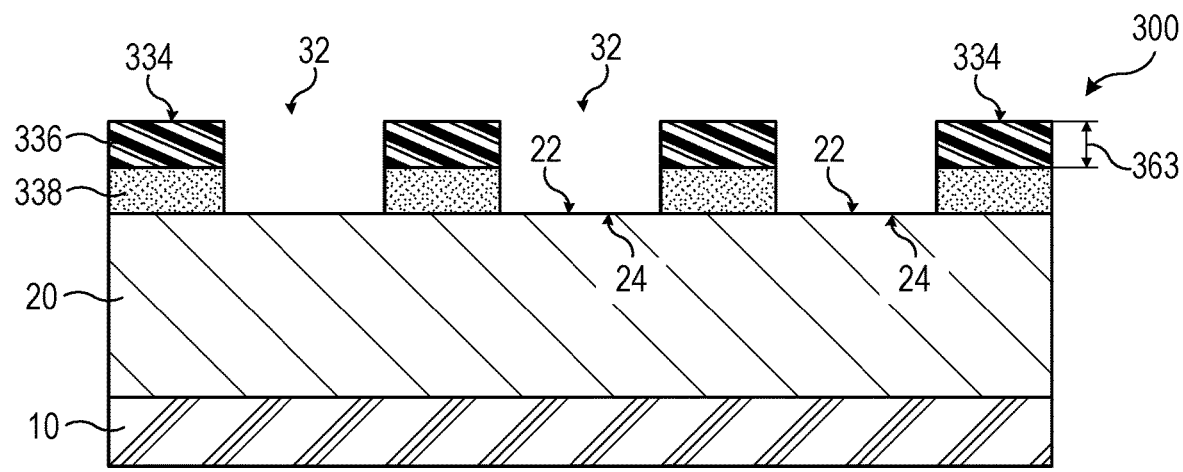
FIGS. 3A, 3B, and 3C illustrate another example method of plasma etching in accordance with an embodiment of the invention, where
Figure 3B:
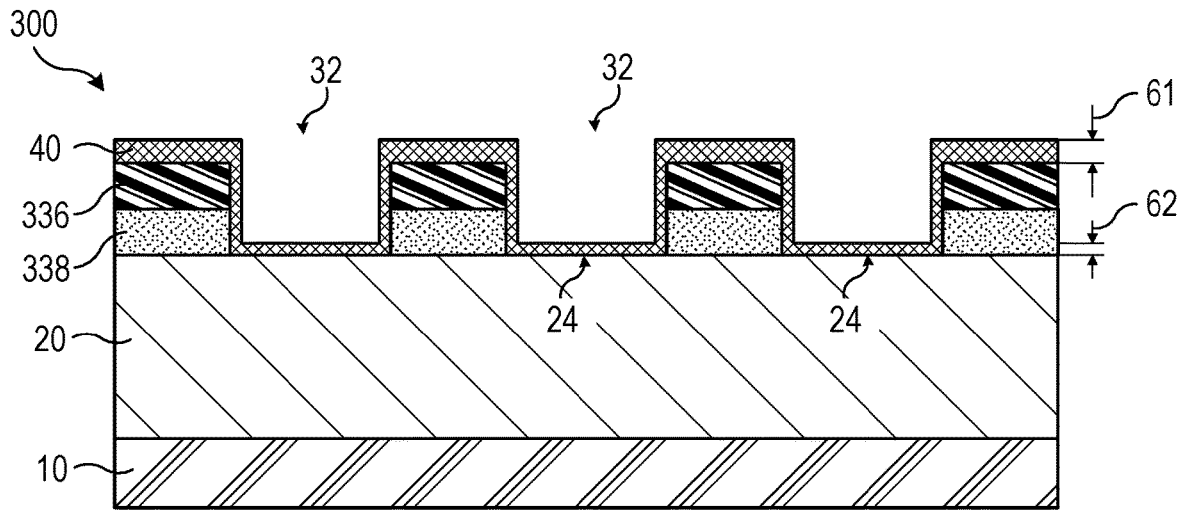
Figure 3C:
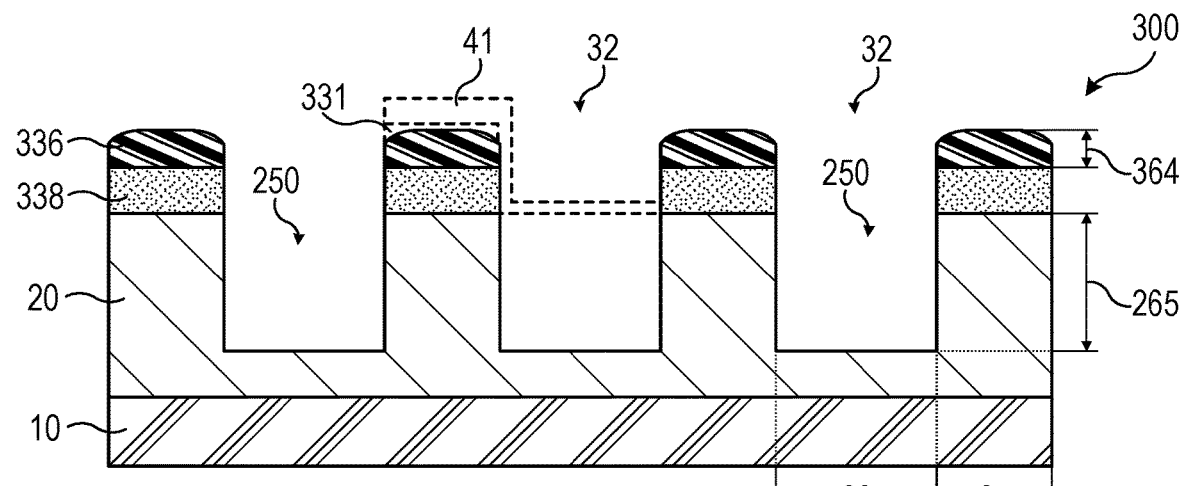

FIGS. 3A, 3B, and 3C illustrate another example method of plasma etching in accordance with an embodiment of the invention, where FIG. 3A illustrates a first mask layer and a second mask layer overlying an etchable layer, FIG. 3B illustrates a protective layer formed over the first mask layer, the second mask layer, and the etchable layer, and FIG. 3C illustrates the first mask layer, the second mask layer, and the etchable layer after an etching process. The example method of plasma etching as illustrated in FIGS. 3A, 3B, and 3C may be a specific implementation of other embodiment methods of plasma etching such as the method of plasma etching described using FIGS. 2A, 2B, and 2C, for example. Similar labels may be as previously described.

Referring to FIG. 3A, a workpiece 300 at an initial stage of a method of plasma etching includes an etchable layer 20 overlying a substrate 10. A first mask layer 336 is included overlying the etchable layer 20. The first mask layer 336 includes a first vertical thickness 363 as illustrated. The first mask layer 336 may include a metal such as a transition metal (e.g. titanium, ruthenium, hafnium, etc.). In some embodiments the first mask layer 336 is a nitride while in other embodiments the first mask layer 336 is an oxide. In some cases, the first mask layer 336 may be considered an upper hard mask. In one embodiment, the first mask layer 336 is a titanium nitride (TiN) layer. The first mask layer 336 may also be a titanium oxide layer, ruthenium oxide, hafnium oxide, among others.

A second mask layer 338 may be included between the first mask layer 336 and the etchable layer 20. For example, the second mask layer 338 may comprise a dielectric material. In some such cases, the second mask layer 338 may be considered a dielectric hard mask. In one embodiment, the second mask layer 338 includes an oxide. In another embodiment, the second mask layer 338 includes a nitride. In various embodiments, the second mask layer 338 includes a low-κ dielectric material and is a dense ULK dielectric material in one embodiment. Optionally, the second mask layer 338 may be omitted and only the first mask layer 336 is included. For example, a hard mask including a transition metal may be used as a solo mask layer.

Referring to FIGS. 3B and 3C, a protective layer 40 is formed in-situ as previously described. The protective layer 40 is subsequently removed in a plasma etching step. As before, portions of the etchable layer 20 are removed during the plasma etching step to form recesses 250 in the etchable layer 20. A portion of the first masking layer 336 including etched mask material 331 is also removed during the plasma etching process resulting in a second vertical thickness 364 of the first mask layer 336. However, the second mask layer 338 is advantageously substantially unaffected by the plasma etching step as shown.

As before, the majority of the first mask layer 336 may remain after the plasma etching step. For example, the second vertical thickness 364 may be greater than 60% of the first vertical thickness. This is in contrast to conventional methods of plasma etching such as, for example, the conventional method illustrated and described using FIGS. 1A and 1B where the dense dielectric layer 103 underlying the titanium nitride layer 104 is undesirably eroded by the plasma etching step.

Figure 4A:
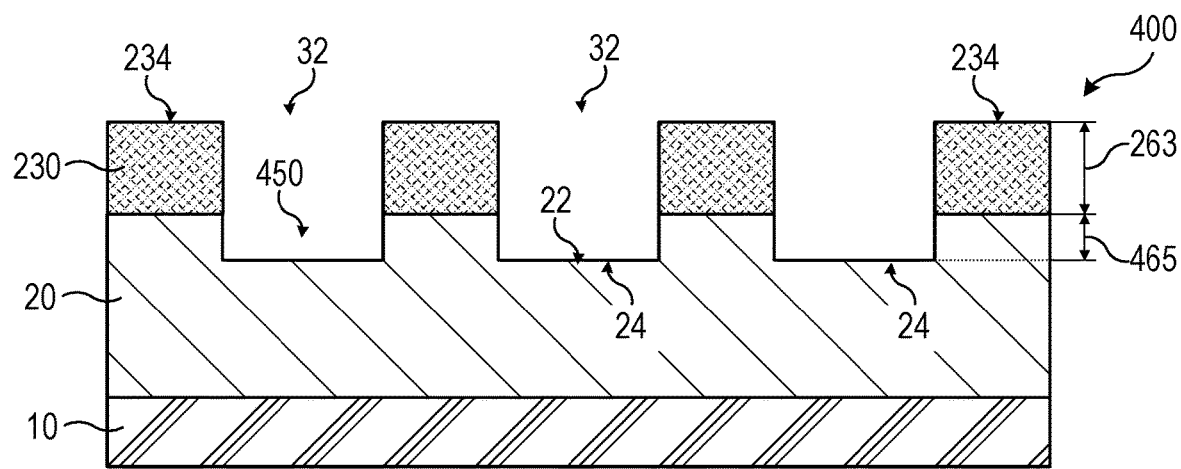
FIGS. 4A, 4B, and 4C illustrate still another example method of plasma etching in accordance with an embodiment of the invention, where
Figure 4B:
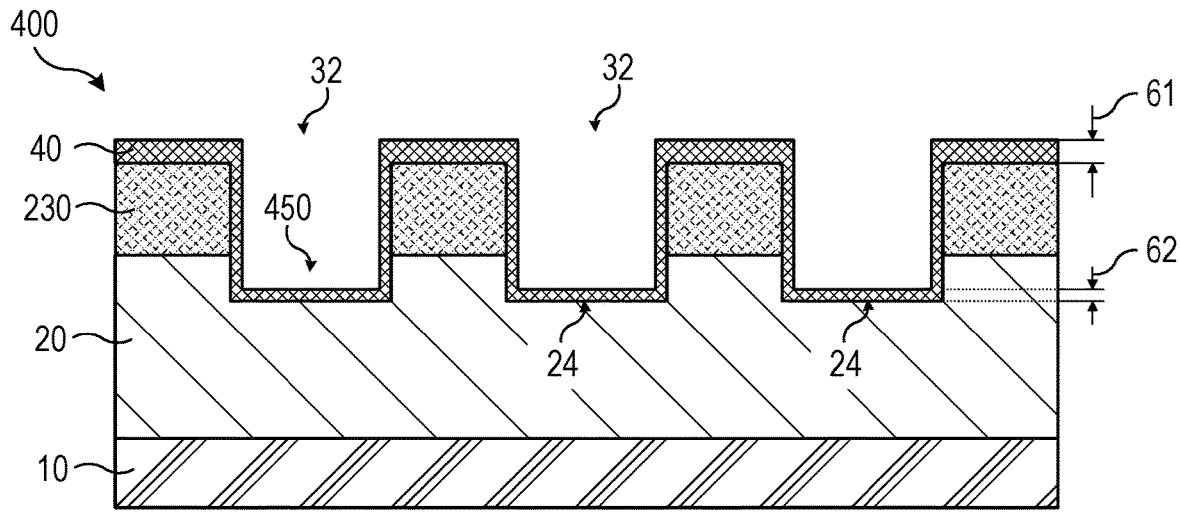
Figure 4C:
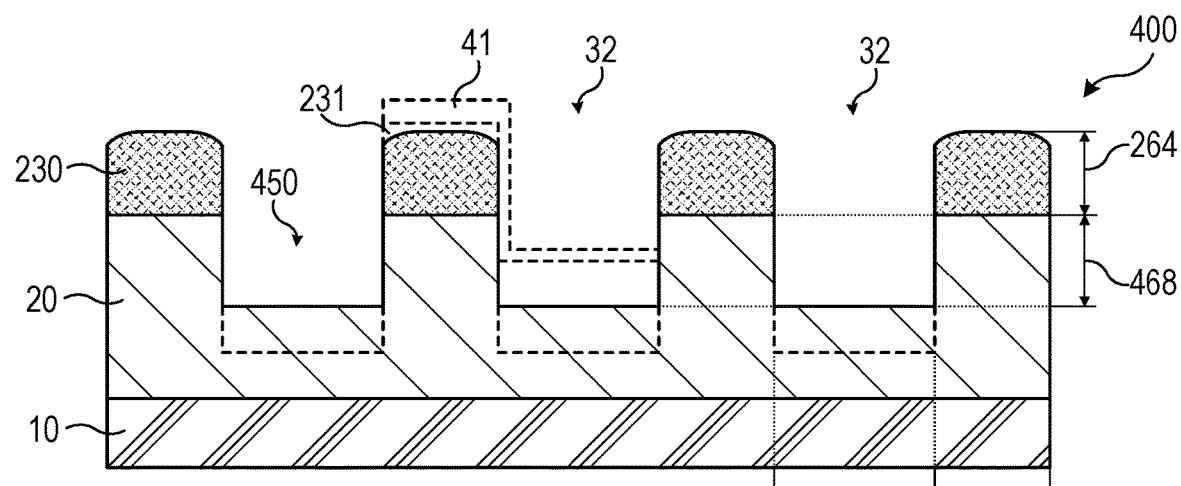

FIGS. 4A, 4B, and 4C illustrate still another example method of plasma etching in accordance with an embodiment of the invention, where FIG. 4A illustrates an etchable layer including recesses vertically aligned with openings in an overlying patterned mask layer, FIG. 4B illustrates a protective layer formed over the patterned mask layer and the recesses of the etchable layer, and FIG. 4C illustrates the patterned mask layer and the etchable layer after an etching process. The example method of plasma etching as illustrated in FIGS. 4A, 4B, and 4C may be a specific implementation of other embodiment methods of plasma etching such as the method of plasma etching described using FIGS. 2A, 2B, and 2C, for example. Similar labels may be as previously described.

Referring to FIG. 4A, a workpiece 400 at an initial stage of a method of plasma etching includes an etchable layer 20 overlying a substrate 10. Additionally, recesses 450 are already formed in the etchable layer 20 at this initial stage. The recesses 450 have an initial vertical depth 465. A patterned mask layer 230 is includes overlying the etchable layer 20 and may be as previously described.

Referring to FIG. 4B, a protective layer 40 is formed in-situ over the patterned mask layer 230 and the recesses 450. The formation of the protective layer 40 may be as previously described. In some embodiments, the recesses 450 may be sufficiently narrow and/or deep so that material of the protective layer 40 does not reach some or all of the exposed surfaces 24 of the etchable layer 20.

Referring to FIG. 4C, a plasma etching step is performed to remove the protective layer 40 and deepen the recesses 450 so that the initial vertical depth 465 is increased to an extended vertical depth 468. In various embodiments, the step of forming a protective layer prior to the workpiece 400 as shown in FIG. 4B may be repeated after the plasma etching step. For example, another protective layer may be formed over the patterned mask layer 230 and the recesses 450 having the extended vertical depth 468. An additional plasma etching step may then be performed to remove additional material (illustrated as dashed lines below the recesses 450 in FIG. 4C) from the etchable layer 20 while still maintaining integrity of the patterned mask layer 230. This two-step in-situ cycle of protection layer formation followed by a plasma etching step may be repeated as desired to increase the depth of the recesses 450.

Figure 5:
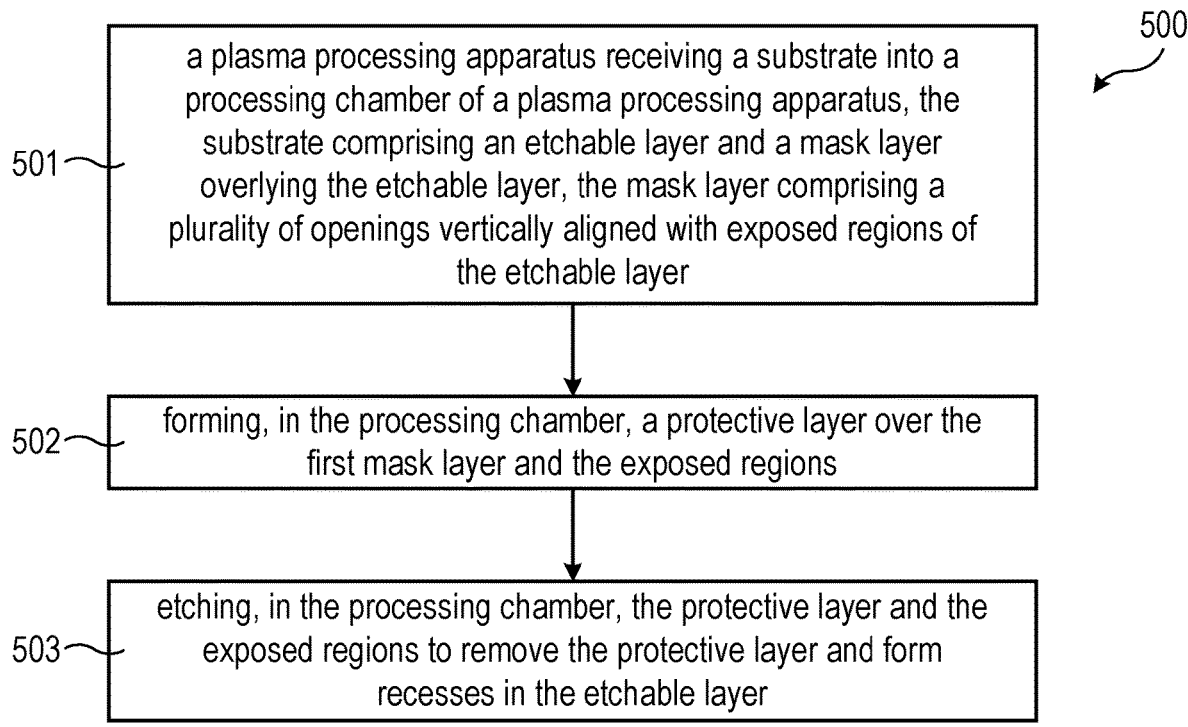
FIG. 5 illustrates a flowchart of an example method of plasma etching in accordance with an embodiment of the invention.
Figure 6:
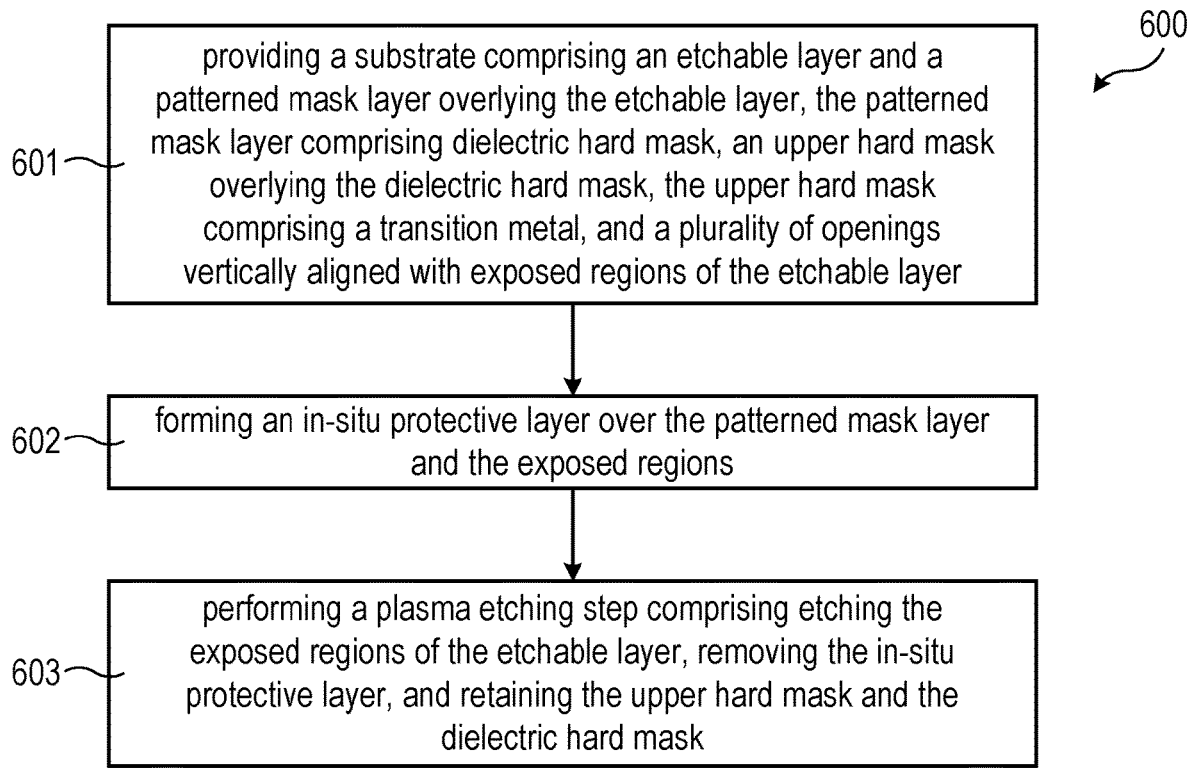
FIG. 6 illustrates a flowchart of another example method of plasma etching in accordance with an embodiment of the invention.

FIGS. 5 and 6 illustrate flowcharts of example methods of plasma etching in accordance with embodiments of the invention. Arrows in the flowchart are intended to indicate an order of performing the method steps unless otherwise indicated. Additional steps may be performed between method steps as described and also as will be apparent to one of ordinary skill of the art without departing from the scope of the invention.

Referring to FIG. 5, a method 500 of plasma etching includes a step 501 of receiving a substrate into a processing chamber of a plasma processing apparatus. The substrate includes an etchable layer and a first mask layer overlying the etchable layer. The first mask layer includes a plurality of openings vertically aligned with exposed regions of the etchable layer. The processing chamber receives the substrate as an initial step in the method 500 of plasma etching.

The substrate may also include a second mask layer between the first mask layer and the etchable layer. The openings may then extend through both the first mask layer and the second mask layer. In one embodiment, the first mask layer comprises a transition metal. In one embodiment, the second mask layer comprises a dielectric.

The method 500 further includes a step 502 of forming, in the processing chamber, a protective layer over the first mask layer and the exposed regions. Step 502 is performed after step 501 without removing the substrate from the processing chamber. Other steps may also be performed between step 501 and step 502, but the substrate is not removed from the processing chamber between step 501 and step 502. For example, a step of etching, in the processing chamber, the exposed regions of the etchable layer after receiving the substrate in step 501 and before forming the protective layer in step 502 may be performed to form initial recesses in the etchable layer.

After forming the protective layer, the method 500 includes a step 503 of etching, in the processing chamber, the protective layer and the exposed regions to remove the protective layer and form recesses in the etchable layer. Before forming the protective layer in step 502, the method may also include a step of creating a vacuum in the processing chamber. Both forming the protective layer in step 502 and etching the protective layer and the exposed regions in step 503 may be performed without breaking the vacuum.

Step 502 and step 503 may be cyclically performed without removing the substrate from the processing chamber. For example, after performing step 503, a subsequent iteration of step 502 of forming, in the processing chamber an additional protective layer over the first mask layer and the recesses in the etchable layer may be performed followed by another iteration of step 503 of etching, in the processing chamber, the additional protective layer and the etchable layer in the recesses to remove the additional protective layer and increase a vertical depth of the recesses. This cycle may be repeated to increase the vertical depth of the recesses while advantageously reducing damage to the mask layer.

Referring now to FIG. 6, a method 600 of plasma processing includes a step 601 of providing a substrate including an etchable layer and a patterned mask layer overlying the etchable layer. The patterned mask layer includes a dielectric hard mask, an upper hard mask overlying the dielectric hard mask, and a plurality of openings vertically aligned with exposed regions of the etchable layer.

The upper hard mask includes a transition metal. In one embodiment, the upper hard mask is a nitride comprising the transition metal. In one embodiment, the upper hard mask is titanium nitride. In another embodiment, the upper hard mask is an oxide comprising the transition metal.

The method 600 also includes a step 602 of forming an in-situ protective layer over the patterned mask layer and the exposed regions and a step 603 of performing a plasma etching step after forming the in-situ protective layer in step 602. Step 603 includes etching the exposed regions of the etchable layer, removing the in-situ protective layer, and retaining the upper hard mask and the dielectric hard mask.

Other steps may also be performed between step 601 and step 602. For example, a step of etching the exposed regions of the etchable layer after providing the substrate and before forming the in-situ protective layer may be performed to form initial recesses in the etchable layer.

Example embodiments of the invention are summarized here. Other embodiments can also be understood from the entirety of the specification as well as the claims filed herein.

Example 1. A method of plasma etching including: receiving, by a plasma processing apparatus, a substrate into a processing chamber of the plasma processing apparatus, the substrate including an etchable layer and a first mask layer overlying the etchable layer, the first mask layer including a plurality of openings vertically aligned with exposed regions of the etchable layer; forming, in the processing chamber, a protective layer over the first mask layer and the exposed regions; and etching, in the processing chamber, the protective layer and the exposed regions to remove the protective layer and form recesses in the etchable layer.

Example 2. The method of example 1, where: the substrate further includes a second mask layer between the first mask layer and the etchable layer, the openings extending through both the first mask layer and the second mask layer; the first mask layer includes a metal, metal oxide, or metal nitride; and the second mask layer includes a dielectric.

Example 3. The method of one of examples 1 and 2, where: the recesses include a first lateral width and a vertical depth, the first lateral width being less than half of the vertical depth; and the first mask layer includes a second lateral width separating adjacent openings of the plurality of openings and substantially equal to the first lateral width.

Example 4. The method of example 3, where the first lateral width and the second lateral width are less than 25 nm.

Example 5. The method of one of examples 1 to 4, further including: creating a vacuum in the processing chamber before forming the protective layer; and where both forming the protective layer and etching the protective layer and the exposed regions are performed without breaking the vacuum.

Example 6. The method of one of examples 1 to 5, further including: cyclically performing forming, in the processing chamber an additional protective layer over the first mask layer and the recesses in the etchable layer, and etching, in the processing chamber, the additional protective layer and the etchable layer in the recesses to remove the additional protective layer and increase a vertical depth of the recesses.

Example 7. The method of one of examples 1 to 6, further including: etching, in the processing chamber, the exposed regions of the etchable layer after receiving the substrate and before forming the protective layer.

Example 8. The method of one of examples 1 to 7, where: the first mask layer includes a first vertical thickness before forming the protective layer; the first mask layer includes a second vertical thickness after etching the protective layer and the exposed regions; and the second vertical thickness is greater than 60% of the first vertical thickness.

Example 9. A method of plasma processing including: in-situ during a plasma etch, forming a protective layer over a patterned mask layer and exposed regions of an etchable layer of a substrate, the protective layer including a first thickness measured from upper surfaces of the patterned mask layer and a second thickness measured from exposed surfaces of the exposed regions, where the first thickness is greater than the second thickness; and in-situ during the plasma etch, concurrently removing the protective layer and etching the etchable layer of the substrate at the exposed regions.

Example 10. The method of example 9, where the first thickness is between about 1 nm and about 10 nm.

Example 11. The method of one of examples 9 and 10, further including cyclically performing the steps of: in-situ during the plasma etch, forming the protective layer; and in-situ during the plasma etch, concurrently removing the protective layer and etching the etchable layer of the substrate at the exposed regions.

Example 12. The method of one of examples 9 to 11, further including: in-situ during the plasma etch, etching the etchable layer of the substrate at the exposed regions before forming the protective layer.

Example 13. The method of one of examples 9 to 12, where forming the protective layer includes forming the protective layer over a period of between about 10 s and about 60 s.

Example 14. A method of plasma processing including: providing a substrate including an etchable layer and a patterned mask layer overlying the etchable layer, the patterned mask layer including a dielectric hard mask, an upper hard mask overlying the dielectric hard mask, the upper hard mask including a metal, metal oxide, or a metal nitride, and a plurality of openings vertically aligned with exposed regions of the etchable layer; forming an in-situ protective layer over the patterned mask layer and the exposed regions; and performing a plasma etching step including etching the exposed regions of the etchable layer, removing the in-situ protective layer, and retaining the upper hard mask and the dielectric hard mask.

Example 15. The method of example 14, where the upper hard mask includes a transition metal.

Example 16. The method of example 14, where the upper hard mask is titanium nitride.

Example 17. The method of example 14, where the upper hard mask is an oxide including a transition metal.

Example 18. The method of one of examples 14 to 17, further including: etching the exposed regions of the etchable layer after providing the substrate and before forming the in-situ protective layer.

Example 19. The method of one of examples 14 to 18, where: the upper hard mask includes a first vertical thickness before forming the in-situ protective layer; the upper hard mask includes a second vertical thickness after performing the plasma etching step; and the second vertical thickness is greater than 60% of the first vertical thickness.

Example 20. The method of one of examples 14 to 19, where forming the in-situ protective layer includes forming the in-situ protective layer over a period of between about 10 s and about 60 s.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma etching comprising:
   receiving, by a plasma processing apparatus, a substrate into a processing chamber of the plasma processing apparatus, the substrate comprising an etchable layer which is a target layer to be etched and a first mask layer overlying the etchable layer, the first mask layer comprising a plurality of openings vertically aligned with exposed regions of the etchable layer;
   forming, in the processing chamber, a protective layer over the first mask layer and the exposed regions, wherein the protection layer protects the first mask layer; and
   etching, in the processing chamber, the protective layer and the exposed regions to remove the protective layer and form recesses or deepen recesses in the etchable layer;
   wherein the etching includes a concurrent etching step during which the protective layer is fully removed, the first mask layer is partially removed, and the etchable layer is concurrently etched, and wherein at a start of said concurrent etching step the protective layer is present on a top and sidewalls of the first mask layer and after said concurrent etching step the protective layer is fully removed from the top and the sidewalls of the first mask layer, the first mask layer is partially removed, the top and the sidewalls of the first mask layer are exposed, and
   wherein:
   the substrate further comprises a second mask layer between the first mask layer and the etchable layer, the openings extending through both the first mask layer and the second mask layer;
   the first mask layer comprises a metal, metal oxide, or metal nitride;
   the second mask layer comprises a dielectric hard mask material on a top surface of the etchable layer, and
   the etchable layer comprises a dielectric layer.

2. The method of claim 1, further comprising:
   creating a vacuum in the processing chamber before forming the protective layer; and
   wherein both forming the protective layer and etching the protective layer and the exposed regions are performed without breaking the vacuum, and
   wherein the protective layer includes at least one of silicon, silicon oxide and silicon nitride, and the protective layer covers both of the first and second mask layers.

3. The method of claim 1, further comprising:
   cyclically performing
   forming, in the processing chamber an additional protective layer over the first mask layer and the recesses in the etchable layer, and etching, in the processing chamber, the additional protective layer and the etchable layer in the recesses to remove the additional protective layer and increase a vertical depth of the recesses.

4. The method of claim 1, further comprising:
etching, in the processing chamber, the exposed regions of the etchable layer after receiving the substrate and before forming the protective layer.

5. The method of claim 1, wherein:
the first mask layer comprises a first vertical thickness before forming the protective layer;
the first mask layer comprises a second vertical thickness after the concurrent etching step, wherein the second vertical thickness is less than the first vertical thickness; and
the second vertical thickness is greater than 60% of the first vertical thickness.

6. The method of claim 1, wherein:
the first mask layer comprises a transition metal;
the protective layer comprises at least one of silicon oxide, silicon nitride, an organic polymer or a fluorocarbon polymer;
at a start of said concurrent etching step the protective layer is present on a top of the first mask layer with a thickness of between about 1 nm and about 10 nm, and the protective layer is present on a top of the exposed surfaces with a thickness of the less than the thickness on top of the first mask layer; and
wherein during said concurrent etching step a portion of the first mask layer is a removed and a vertical thickness of the first mask layer is 50% or larger upon completion of the concurrent etching step compared to the vertical thickness prior to the concurrent etching step.

7. The method of claim 1, wherein:
the recesses comprise a first lateral width and a vertical depth, the first lateral width being less than half of the vertical depth; and
the first mask layer comprises a second lateral width separating adjacent openings of the plurality of openings and substantially equal to the first lateral width.

8. The method of claim 7, wherein the first lateral width and the second lateral width are less than 25 nm.

9. A method of plasma processing comprising:
in-situ forming a protective layer over a patterned mask layer and exposed regions of an etchable layer of a substrate such that the protective layer protects the patterned mask layer, and wherein the etchable layer is a target layer to be etched, the protective layer comprising a first thickness measured from upper surfaces of the patterned mask layer and a second thickness measured from exposed surfaces of the exposed regions, wherein the first thickness is greater than the second thickness, and wherein the first thickness is between about 1 nm and about 10 nm; and
in-situ performing a concurrent plasma etch of concurrently removing the protective layer and etching the etchable layer of the substrate at the exposed regions, wherein the mask layer comprises a dielectric hard mask on a top surface of the etchable layer and the etchable layer includes a semiconductor material or a low-k dielectric material, and
wherein the protective layer comprises at least one of silicon, silicon nitride or silicon oxide.

10. The method of claim 9, further comprising cyclically performing the steps of:
in-situ forming the protective layer; and
in-situ performing the concurrent plasma etch, concurrently removing the protective layer and etching the etchable layer of the substrate at the exposed regions.

11. The method of claim 9, further comprising:
in-situ, etching the etchable layer of the substrate at the exposed regions before forming the protective layer.

12. The method of claim 9,
wherein during the concurrent plasma etch a portion of the patterned mask layer is removed and the patterned mask layer has a vertical thickness 50% or more after the concurrent plasma etch compared to prior to the concurrent plasma etch.

13. The method of claim 9, wherein the step of in-situ performing the concurrent plasma etch of concurrently removing the protective layer and etching the etchable layer of the substrate at the exposed regions includes fully removing the protective layer from the patterned mask layer.

14. The method of claim 13, wherein the step of in-situ forming the protective layer over the patterned mask layer includes forming the protective layer on the upper surfaces of the patterned mask layer and on sidewalls of the patterned mask layer, and wherein the step of concurrent plasma etch of concurrently removing the protective layer and etching the etchable layer of the substrate at the exposed regions includes fully removing the protective layer from the upper surfaces of the patterned mask layer and the sidewalls of the patterned mask layer.

15. A method of plasma processing comprising:
providing a substrate comprising an etchable layer which is a target layer to be etched and a patterned mask layer overlying the etchable layer, the etchable layer including at least one of a low-k dielectric, silicon or germanium, the patterned mask layer comprising
a dielectric hard mask overlying the etchable layer,
an upper hard mask overlying the dielectric hard mask, the upper hard mask comprising a metal, metal oxide, or a metal nitride, and
a plurality of openings vertically aligned with exposed regions of the etchable layer;
forming an in-situ protective layer over the patterned mask layer and the exposed regions such that the in-situ protective layer protects the patterned mask layer; and
performing a plasma etching step, wherein the plasma etching step is a concurrent plasma etch step during which: (i) the in-situ protective layer is fully removed, (ii) the etchable layer is etched, and (iii) a portion of the upper hard mask is removed with at least 50% of a vertical thickness of the upper hard mask remaining after the concurrent plasma etch step compared to prior to the concurrent plasma etch step.

16. The method of claim 15, wherein the upper hard mask comprises a transition metal.

17. The method of claim 15, wherein the upper hard mask is titanium nitride.

18. The method of claim 15, wherein the upper hard mask is an oxide comprising a transition metal.

19. The method of claim 15, further comprising:
etching the exposed regions of the etchable layer after providing the substrate and before forming the in-situ protective layer.

20. The method of claim 15, wherein:
the upper hard mask comprises a first vertical thickness before forming the in-situ protective layer;
the upper hard mask comprises a second vertical thickness after performing the plasma etching step; and
the second vertical thickness is greater than 60% of the first vertical thickness.

21. The method of claim 15, wherein forming the in-situ protective layer comprises forming the in-situ protective layer over a period of between about 10 s and about 60 s.

22. The method of claim 15, wherein the protective layer includes at least one of silicon, silicon oxide and silicon nitride.

23. The method of claim 15, wherein the forming the in-situ protective layer over the patterned mask layer and the exposed regions includes forming the in-situ protective layer over a top surface and vertical sidewalls of the patterned mask layer, and performing the plasma etching step includes fully removing the in-situ protective layer over the top surface and the vertical sidewalls of the patterned mask layer.

24. The method of claim 15, wherein at a start of said concurrent plasma etch, the in-situ protective layer is present on top of the upper hard mask and on top of the exposed regions of the etchable layer with a thickness of the in-situ protective layer larger on top of the upper hard mask than on top of the exposed regions of the etchable layer.

25. The method of claim 24, wherein the upper hard mask includes a transition metal, wherein at the start of said concurrent plasma etch the thickness of the in-situ protective layer has a thickness on top of the upper hard mask which is between about 1 nm and about 10 nm.

\* \* \* \* \*